March 26, 1957 E. K. NELSON 2,786,901

CASCODE AMPLIFIER

Filed April 26, 1952

INVENTOR.
EDWIN KEITH NELSON

BY

Ostrolenk & Faber

ATTORNEYS 2,786,901

CASCODE AMPLIFIER

Edwin Keith Nelson, Pico, Calif., assignor to Standard Coil Products Co., Inc., Los Angeles, Calif., a corporation of Illinois Application April 26, 1952, Serial No. 284,557

2 Claims. (Cl. 179—171)

My present invention relates to wide band amplifiers and more particularly to series connected amplifiers commonly known as cascode amplifiers.

A cascode amplifier consists essentially of two multi-electrode electron tubes, one having its cathode grounded and its plate connected directly to the cathode of the second tube where the grid of the second tube is also grounded.

The first tube from now on will be referred to as the grounded cathode tube while the other will be referred to as the grounded grid tube.

The combination of the two tubes in series produces as is well-known in the art an amplifier having a relatively high gain also at very high frequencies, in particular at television frequencies. Therefore, cascode amplifiers having wide band characteristics are essentially used as radio frequency amplifiers in television input tuners.

Television input tuners are required to operate in fringe areas and also near transmitting stations. In other words, television input tuners and, therefore, the cascode amplifiers used in these tuners will have to operate at signal levels which vary considerably depending on the location of the television receiving set and, therefore, the location of the cascode amplifier.

The cascode amplifier may be provided with an automatic gain control network so that it may have a bias varying from ½ volt to 8 and 9 volts, the low bias for fringe areas and the high bias for areas near the transmitting stations.

This variation in bias level permits considerable variation in the amplitude of the incoming television signals, thus theoretically permitting the use of cascode amplifiers at different distances from the transmitting station.

On the other hand, it was found experimentally that if a cascode amplifier was regulated to have a flat gain at an intermediate position between the fringe area and the transmitting station and the cascode amplifier was then operated in the fringe area that the gain versus frequency curve while flat in the intermediate location became tilted at the highest frequencies when the cascode amplifier was operated in fringe areas.

Similarly, it was found that the same cascode amplifier had a peaked or tilted effect at the low frequencies when the cascode amplifier was located near the transmitting station. To be more specific, the peaked or tilt effect would occur at relatively high frequencies for low values of bias voltage and it would occur at relatively low frequencies for high values of the bias voltage where the bias voltage is intended to be the voltage difference between the grid and the cathode of the grounded grid tube of a cascode amplifier.

I have found that a great deal of this shift or peaking effect occurred in the plate of the grounded grid tube of a cascode amplifier, being caused by the change in the effective capacity between the cathode and the plate of the grounded grid tube due to shift in its characteristics caused by the variations of the bias voltage.

My novel circuits overcome this problem by effectively neutralizing the capacitance existing between the plate and cathode of the grounded grid tube of the cascode amplifier.

By my novel circuit means I, therefore, eliminate any peaking effect in the response curve of cascode amplifiers.

My novel circuit means consists essentially of a capacitance bridge where the plate to cathode capacitance of the grounded grid tube to be neutralized forms one arm of this bridge, another arm being formed by a trimmer capacitance connected between the plate of the grounded grid tube and ground, the third arm being formed by a small by-pass capacitance and the last arm being formed by the so-called neutralizing capacitance.

When this bridge is balanced by appropriate variation or selection of the neutralizing and the by-pass capacitance, the plate to cathode capacitance will be completely neutralized which means that for practical purposes the cathode to plate capacitance of the grounded grid tube may be considered to be removed from the tube itself.

More specifically, the grounded cathode tube has applied to its grid an AGC voltage. As this AGC voltage changes, it produces a change in both the plate resistance and the plate current of the grounded cathode tube. Since, as previously mentioned, the grounded cathode tube is in series and directly connected to the grounded grid tube, the above-described changes will appear also on the grounded grid tube.

In other words, as the bias applied to the grounded cathode tube increases, the plate resistance of the grounded grid section will change and so will its plate current so that effectively a change in the grid bias on the grid of the grounded cathode tube produces a proportional change in the grid circuit of the grounded grid tube, the main difference being the fact that while in the grounded cathode tube the bias is applied at the grid, in the grounded grid tube the bias is applied at the cathode of the tube.

The bias of the grid of the grounded grid tube may be kept constant with respect to ground by means of a bias network so that any change in cathode potential with respect to ground would correspond to a change in the bias voltage between the grid and the cathode of the grounded grid tube.

Between the plate and the cathode of the grounded grid tube is applied the previously described neutralizing bridge which will make the frequency response of the cascode amplifier independent of the D. C. bias applied to the grid of the grounded cathode section.

Accordingly, the main object of my present invention is the provision of means whereby the frequency response of a cascode amplifier is made independent of the amplitude of the signal applied to the input of the cascode amplifier.

A more specific object of my present invention is the provision of circuit means for neutralizing the plate to cathode capacitance of the grounded grid section of a cascode amplifier.

Another object of my present invention is the provision of means whereby the potential between the grid and ground remains constant for wide variations in input signal strength while the grid to cathode potential is varied in a certain proportion with respect to the bias applied to the grid of the grounded cathode section of a cascode amplifier.

A further object of my present invention is the provision of simple and economical means to compensate for changes in plate capacity in the grounded grid section of a cascode amplifier due to changes in the grid to cathode bias.

The foregoing and many other objects of my invention will become apparent in the following description and drawings in which.

Figure 1:
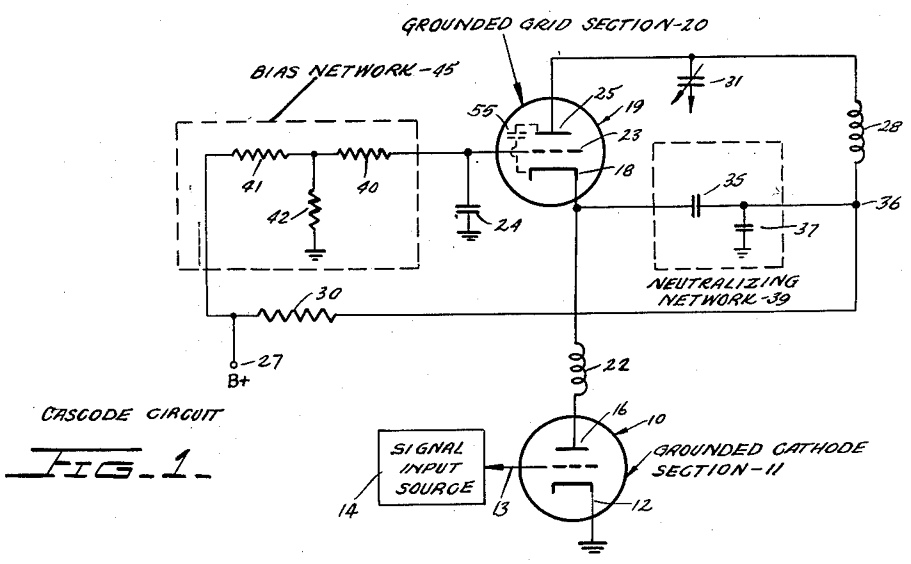
Figure 1 is a circuit diagram of a cascode amplifier embodying my present invention.

Referring first to Figure 1, triode 10 which constitutes with its associated circuits the grounded cathode section 11 has its cathode 12 connected directly to ground while its grid 13 is connected to the signal input source shown at 14.

Plate 16 of tube 10 is connected to cathode 18 of tube 19 which constitutes with its associated circuits the grounded grid section 20. Plate 16 is connected to cathode 18 through an inductance 22. The use of such a series circuit comprising in this case inductance 22 is described in co-pending application Serial No. 211,959 filed February 20, 1951.

Grid 23 of tube 19 of grounded grid section 20 is connected to ground through a capacitance 24, while the plate 25 of tube 19 is connected to the power supply shown at 27 and denoted by B+ through a tuning coil 28 and a dropping resistance 30. Plate 25 is also connected to a trimmer capacitance 31 for tuning with inductance 28. Mutually coupled to the tuning coil 28 is the secondary coil 29 which with coil 28 forms output transformer 28—29. Thus, the signal amplified by the present amplifier will appear across output coil 29 of output transformer 28—29. It is obvious that other similar coupling means can be substituted for coil 29 in order to derive a useful output from the present amplifier.

Another capacitance 35 is connected between cathode 18 and the connecting point 36 between tuning coil 28 and dropping resistance 30. A by-pass capacitance 37 is connected between the same connecting point 36 and ground. Capacitances 35 and 37 constitute the neutralizing network 39, the function of which will be described hereinafter in connection with Figure 2.

The grid 23 of tube 19 which is connected to ground through capacitance 24 is also connected through series resistance 40 between two resistances 41 and 42 where resistance 42 is connected to ground while resistance 41 is connected to the previously mentioned power supply 27. In other words, resistances 41 and 42 in series constitute a voltage divider and the voltage applied to grid 23 through series resistance 40 connected between resistances 41 and 42 is then a function of the power supply voltage 27 and the ratio of resistances 41 and 42.

The combination of divider resistances 41 and 42 and the series resistance 40 constitutes the biasing network 45 for grounded grid tube 19.

Figure 3:
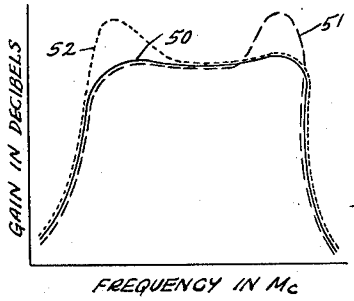
Figure 3 is a plot of the frequency response curve of a cascode amplifier showing a flat characteristic and a tilt characteristic.

In the previously known cascode amplifiers, it was found that the frequency response curve shown at 50 in Figure 3 was of the general shape shown therein when an intermediate value of bias is applied to grid 13 of tube 10 of grounded cathode section 11.

In other words, the frequency response curve for cascode amplifiers at intermediate values of bias between grid 13 and cathode 12 of tube 10 is practically flat, providing, therefore, a practically distortionless amplification of the signals applied to the cascode amplifier.

It was found, on the other hand, that when the bias applied to grid 13 of tube 10 became small, for example because of the fading of signals due to the remote location of the cascode amplifier from a transmission station, a peak was found to exist at the higher frequencies in the frequency response curve shown at 51. This peaked effect, also called tilt, may be quite pronounced and may cause, therefore, considerable distortion of the signals amplified by these previous cascode amplifiers.

It was further found that when the bias applied to the grid 13 of grounded cathode section 11 was relatively high caused, for example, by the large amplitude of the signals applied to the grid 13 of tube 10 because of the proximity of the cascode amplifier to the transmitting station, a frequency response curve similar to the one shown at 52 would be obtained for these previous cascode amplifiers. In this case again, distortion in the signals amplified by the cascode amplifier would occur.

I have found that the cause for the appearance of peaks at low and high values of bias voltage was to be found in the variation of plate to cathode effective capacitance 55 of tube 19 of grounded grid section 20. This effective capacitance 55 is changed by the shift in the characteristics of the grounded grid section 20 caused by the change of the bias voltage applied between grid 13 and cathode 12 of the grounded cathode section 11.

The fact that the characteristics of the grounded grid section 20 change because of the change in bias between grid 13 and cathode 12 of grounded cathode section 11 will be better understood from the following description of the operation of the cascode amplifier when the bias voltage between grid 13 and cathode 12 is changed.

The bias voltage applied to grid 13 of tube 10 of grounded cathode section 11 is the AGC voltage produced at the detectors (not shown) of the television input tuner on which the cascode amplifier is mounted. As this AGC voltage between grid 13 and cathode 12 changes, it will produce a change in both the plate resistance and the plate characteristic curve of the grounded cathode tube 10. Since tube 10 is directly coupled to the cathode 18 of grounded grid section tube 19, a corresponding change appears at tube 19 of the grounded grid section 20.

To be more specific, as the bias between grid 13 and cathode 12 increases, or in other words, the grid 13 becomes negative with respect to cathode 12, the plate resistance of tube 10 will increase causing a decrease in plate current. Since this is also the plate current that is to flow through tube 19 of grounded grid section 20, cathode 18 will experience a change in potential so that the potential difference between grid 23 and cathode 18 of tube 19 will be correspondingly changed causing a similar change in the plate characteristic curve.

This is the same as applying a negative bias between grid 23 and cathode 18 of tube 19 in some proportion of the AGC bias applied between grid 13 and tube 12 of tube 10, the only difference between the two tubes 10 and 19 being that while the AGC bias is applied to the grid 13 of tube 10, the bias proportional to the AGC voltage is applied to tube 19 at its cathode 18.

This shift in the plate characteristics of tubes 10 and 19 causes a peaked effect found in previously known cascode amplifiers.

I have found that by utilizing my neutralizing network 39 in conjunction with a plate capacitance trimmer 31 it is possible to effectively eliminate any influence of plate to cathode capacitance 55 over the shape of the frequency response curves of a cascode amplifier.

Figure 2:
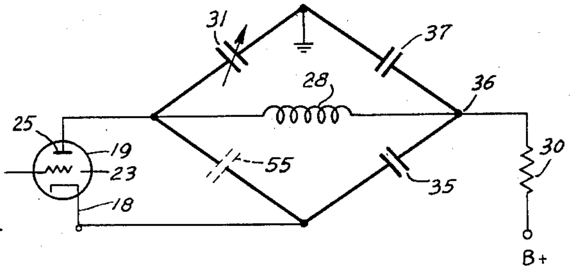
Figure 2 is a circuit diagram of my novel capacitor bridge circuit.

Referring in fact to Figure 2, I have shown therein the capacitor bridge used for neutralizing the effective capacitance 55 between plate 25 and cathode 18 of grounded grid section 20 connected to the trimmer capacitor 31 on one side and neutralizing capacitance 35 on the other side. Between trimmer capacitor 31 and neutralizing capacitor 35 is connected cathode by-pass capacitor 37.

As can be seen in Figure 2, the four capacitances 31, 37, 35 and 55 constitute a bridge which can be balanced by the appropriate selection of capacitances 35 and 37. When the values chosen for capacitors 35 and 37 are such that they balance in bridge 60 the capacitances 31 and 55, then the neutralization of the effective capacitance 55 between plate 25 and cathode 18 of grounded grid section 20 is completed.

It was found, in fact, that when the neutralizing network 39 was connected to a cascode amplifier in the manner shown in Figure 1, the frequency response curves of the novel cascode amplifier would have no peaks at either the low, intermediate or high values of the AGC voltage applied between grid 13 and cathode 12 of grounded cathode section 11.

As previously mentioned, grid 23 of grounded grid section 20 is connected to a bias network 45 consisting of voltage divider 41—42, a series resistance 40 connected between grid 23 of tube 19 and resistances 41 and 42.

By this means, grid 23 of tube 19 is blocked at a certain preselected voltage and by-passed to ground through capacitance 24. In other words, it may be possible to consider grid 23 to have a practically constant D. C. potential applied to it with relation to ground, the potential as previously mentioned being determined by the ratio of the values between resistances 41 and 42 and the voltage of power supply 27.

In the foregoing I have described my invention solely in connection with specific illustrative embodiments thereof. Since many variations and modifications of my invention will now be obvious to those skilled in the art, I prefer to be bound not by the specific disclosures herein contained but only by the appended claims.

I claim:

1. A wide band amplifier stabilized for weak and strong television signal reception comprising a grounded-cathode grid-input first triode stage; a signal-grounded grid, cathode input second triode stage; an inductor in series connection between the output of said first triode stage and the cathode of said second triode stage and provide cascode amplification; an output coil connected to the anode of said second triode stage and to the source of unipotential; and a neutralizing network incorporating the anode-to-cathode capacitance of said second triode stage, a trimmer capacitor in circuit between the second triode anode and signal ground, a by-pass condenser connected between signal ground and the uni-potential side of said output coil, and a neutralizing condenser in circuit between said output coil uni-potential side and the cathode of said second triode.

2. A wide band amplifier stabilized for weak and strong television signal reception comprising a grounded-cathode grid-input first triode stage; a signal-grounded grid, cathode input second triode stage; an inductor in series connection between the output of said first triode stage and the cathode of said second triode stage and provide cascode amplification; an output coil connected to the anode of said second triode stage and to the source of uni-potential; and a neutralizing network incorporating the anode-to-cathode capacitance of said second triode stage, as one arm and constituting a trimmer capacitor in circuit between the second triode anode and signal ground, a by-pass condenser connected between signal ground and the uni-potential side of said output coil, and a neutralizing condenser in circuit between said output coil uni-potential side and the cathode of said second triode, wherein said trimmer capacitor, and said by-pass and neutralizing condensers constitute three balancing arms of the network for said one arm, whereby substantially uniform frequency response is provided by the amplifier over wide AGC biasing potentials applied thereto.

References Cited in the file of this patent

UNITED STATES PATENTS

| | | |
|---|---|---|
| 2,052,986 | Nyman | Sept. 1, 1936 |
| 2,398,050 | Schreiner | Apr. 9, 1946 |
| 2,525,632 | Anderson | Oct. 10, 1950 |
| 2,550,930 | Koch | May 1, 1951 |
| 2,605,409 | Forbes | July 29, 1952 |

FOREIGN PATENTS

| | | |
|---|---|---|
| 668,825 | Great Britain | Mar. 26, 1952 |

OTHER REFERENCES

Sands: Abstract of application Serial Number 657,418, published November 14, 1950, 640 O. G. 667.

"Use of New Low-Noise Twin Triode in Television Tuners," by Cohen from R. C. A. Review, vol. XII, issue 1, pages 3–25, March 1951, pages 19 and 20 pertinent.